United States Patent [19]

Ishido

[11] Patent Number: 5,324,535
[45] Date of Patent: Jun. 28, 1994

[54] PROCESS OF COATING PRINTED WIRING BOARD WITH SOLID SOLDER RESIST PATTERN FORMED FROM LIQUID AND DRY SOLDER RESIST FILMS

[75] Inventor: Kiminori Ishido, Tokyo, Japan

[73] Assignee: NEC Corporation, Tokyo, Japan

[21] Appl. No.: 127,114

[22] Filed: Sep. 27, 1993

Related U.S. Application Data

[63] Continuation of Ser. No. 838,838, Feb. 21, 1992, abandoned.

[30] Foreign Application Priority Data

Feb. 22, 1991 [JP] Japan .................................. 3-028478

[51] Int. Cl.⁵ .............................................. B05D 5/12
[52] U.S. Cl. .......................................... 427/76; 427/77;
427/259; 427/264; 427/265; 427/272; 427/282;
427/385.5; 427/402
[58] Field of Search ............... 427/264, 265, 282, 402,
427/510, 76, 77, 259, 272, 385.5

[56] References Cited

U.S. PATENT DOCUMENTS

4,447,519 5/1984 Pritikin .................................. 427/97
4,668,332 5/1987 Ohnuki et al. ....................... 156/630
4,804,615 2/1989 Larson et al. ......................... 427/97

Primary Examiner—Shrive Beck
Assistant Examiner—Benjamin L. Utech
Attorney, Agent, or Firm—Leydig, Voit & Mayer

[57] ABSTRACT

A printed wiring board is selectively covered with solid solder resist pattern implemented by a first solder resist sub-pattern formed from liquid photo-sensitive solder resist and a second solder resist sub-pattern formed from photo-sensitive fry films, and a first area with pads and a second area with a through-hole or via-hole are respectively covered with the first solder resist sub-pattern and the second solder resist sub-pattern so that any peeling of the first solder resist sub-pattern and any residue of the liquid photo-sensitive solder resist in the through-hole or via-hole never take place.

7 Claims, 10 Drawing Sheets

PROCESS OF COATING PRINTED WIRING BOARD WITH SOLID SOLDER RESIST PATTERN FORMED FROM LIQUID AND DRY SOLDER RESIST FILMS

This application is a continuation of application Ser. No. 07/838,838, filed Feb. 21, 1992, now abandoned.

FIELD OF THE INVENTION

This invention relates to a printed wiring board used for an electric/electronic system and, more particularly, to a process of coating the printed wiring board with a solid solder resist pattern.

DESCRIPTION OF THE RELATED ART

On a printed wiring board are formed a wiring pattern, pads and through-holes which are selectively covered with a solder resist film, which allows integrated circuit chips mounted on the pads to serve for prolonged time period. The solder resist film is usually formed from a liquid photo-sensitive solder resist or a photo-sensitive dry-film.

Figure 1A:
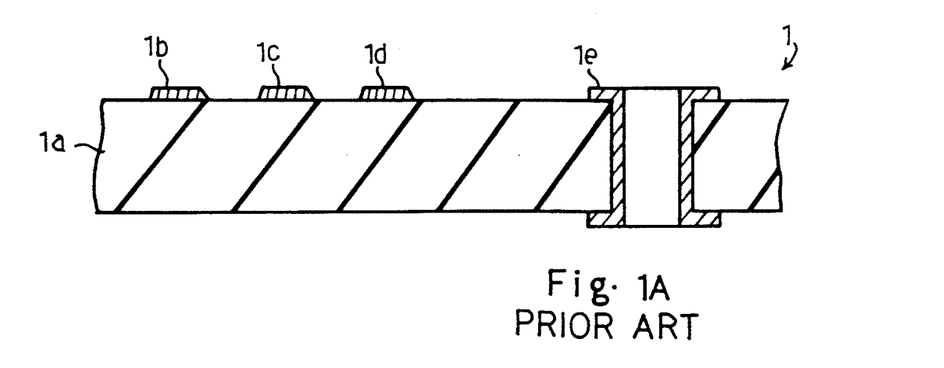
FIGS. 1A, 2B, 1D, 1E, and 1F are cross sectional views showing the prior art process sequence using the liquid photo-sensitive solder resist.
Figure 1B:
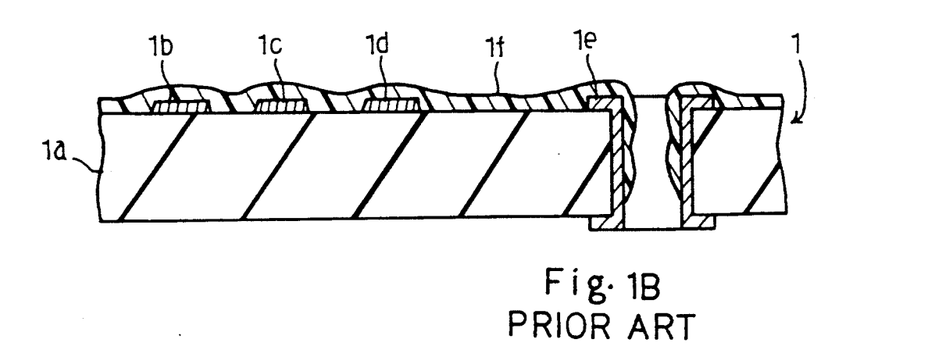

A typical example of the prior art process using the liquid photo-sensitive solder resist is shown in FIGS. 1A to 1F. The prior art process sequence starts with preparation of a printed wiring board 1, and the printed wiring board 1 is implemented by an insulating substrate 1a with pads 1b, 1c and 1d as well as with a through-hole 1e as shown in FIG. 1A. One of the major surfaces of the printed wiring board 1 is perfectly covered with liquid photo-sensitive solder resist, and valleys between the pads 1a to 1c are completely filled with the liquid photo-sensitive solder resist. However, the liquid photo-sensitive solder resist flows into the through hole 1e. The liquid photo-sensitive solder resist is dried, and the major surface of the printed wiring board 1 is coated with a photo-sensitive solder resist film 1f as shown in FIG. 1B.

Figure 1C:
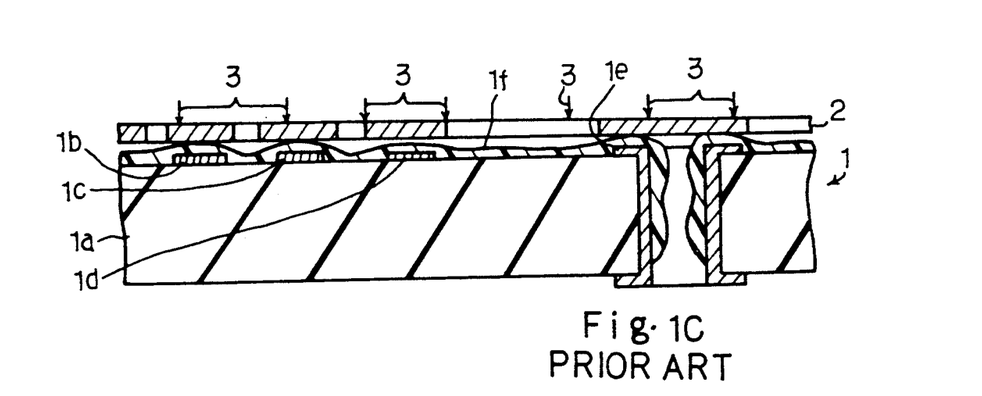

A photo-mask with a predetermined pattern 2 is moved over the photo-sensitive solder resist film 1f, and ultra-violet 3 light is radiated through the photo-mask 2 to the photo-sensitive solder resist film 1f as shown in FIG. 1C. Then, the photo-sensitive solder resist film 1f is partially photo-cured, and the predetermined pattern is transferred to the photo-sensitive solder resist film 1f. In this instance, the ultra-violet light is fallen onto portions of the photo-sensitive solder resist film 1f between the pads 1b, 1c and 1d and the through-hole 1e, and allows these portions to be photo-cured.

The printed wiring board 1 thus covered with the photo-sensitive solder resist film 1f is developed in an appropriate solution, and the photo-sensitive solder resist film 1f shielded from the ultra-violet light is removed from the major surface of the printed wiring board 1. Accordingly, the photo-sensitive solder resist film 1f exposed to the ultra-violet light is left on the major surface, and is labeled with reference numeral 4. Though not exposed to the ultra-violet light, the photo-sensitive solder resist film 1f in the through-hole 1e is hardly removed, and is left in the through-hole 1e as residue 5 shown in FIG. 1D.

Figure 1D:
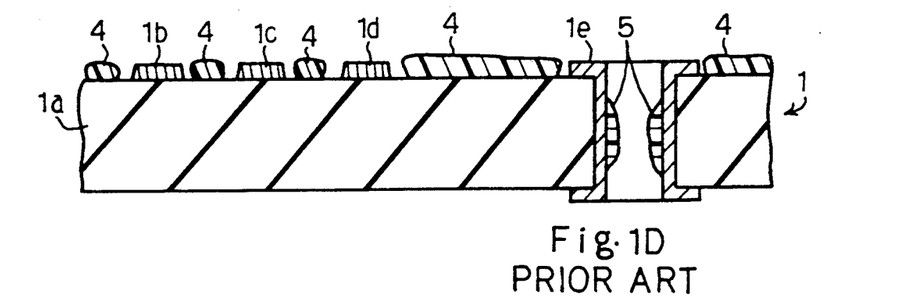
Figure 1E:
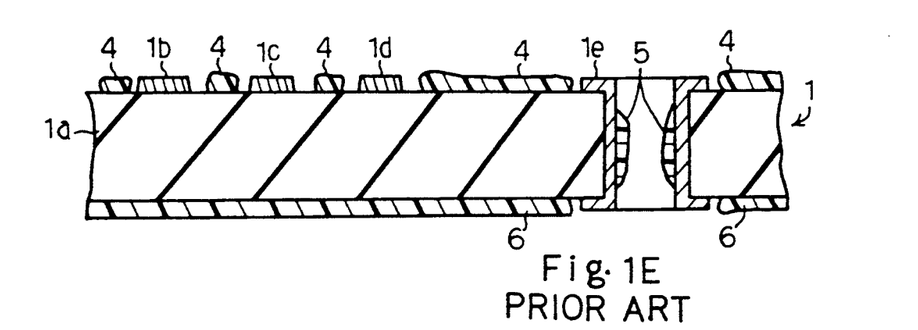

The coating with the liquid photo-sensitive solder resist and the patterning of the photo-sensitive solder resist film are repeated for the other major surface of the printed wiring board 1, and the other major surface is selectively covered with a solder resist film 6 as shown in FIG. 1E.

Figure 1F:
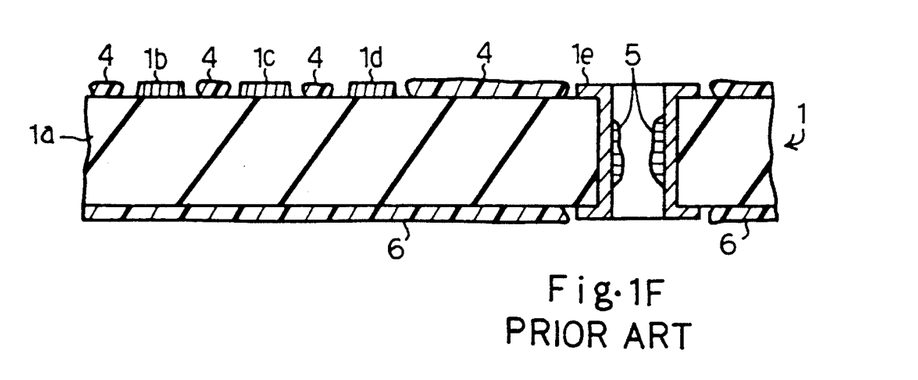

After both major surfaces of the printed wiring board 1 are selectively covered with the solder resist films 4 and 6, the printed wiring board 1 is treated or cured with heat, and the solder resist films 4 and 6 are perfectly photo-cured. The residue 5 is also applied with the heat, and is also photo-cured. The resultant structure is shown in FIG. 1F. Integrated circuit chips are mounted on the pads 1b to 1d, and are appropriately soldered to a wiring pattern (not shown).

One of the problems inherent in the first prior art process using the liquid photo-sensitive solder resist is the residue 5 left in the through-hole 1e, and the residue 5 deteriorates reliability of soldering process. If the through-hole 1e is produced using a high aspect ratio, the residue 5 is more likely to remain in the through-hole 1e. However, the liquid photo-sensitive solder resist can perfectly coat the major surface of the printed wiring board 1, and the solder resist film 4 suitably cover the major surface of the printed wiring board 1.

Figure 2A:
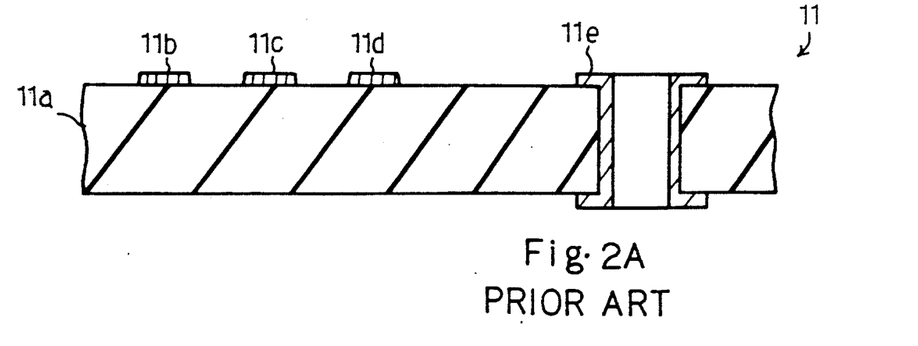
Figure 2B:
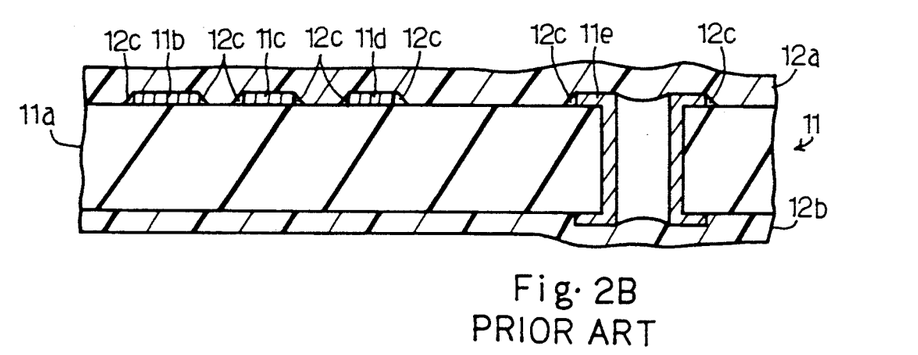

Another prior art process using the photo-sensitive dry film is illustrated in FIGS. 2A to 2E. The prior art process sequence also starts with preparation of a printed wiring board 11 which is implemented by an insulating substrate 11a with pads 11b, 11c and 11d as well as with a through-hole 11e as shown in FIG. 2A. Photo-sensitive dry films 12a and 12b are laminated on both major surfaces of the printed wiring board 11. However, the photo-sensitive dry films 12a and 12b can not strictly trace the profiles of the major surfaces of the printed wiring board 11, and hollow spaces 12c take place along the side edges of the pads 11b to 11d and the through-hole 11e as shown in FIG. 2B.

Figure 2C:
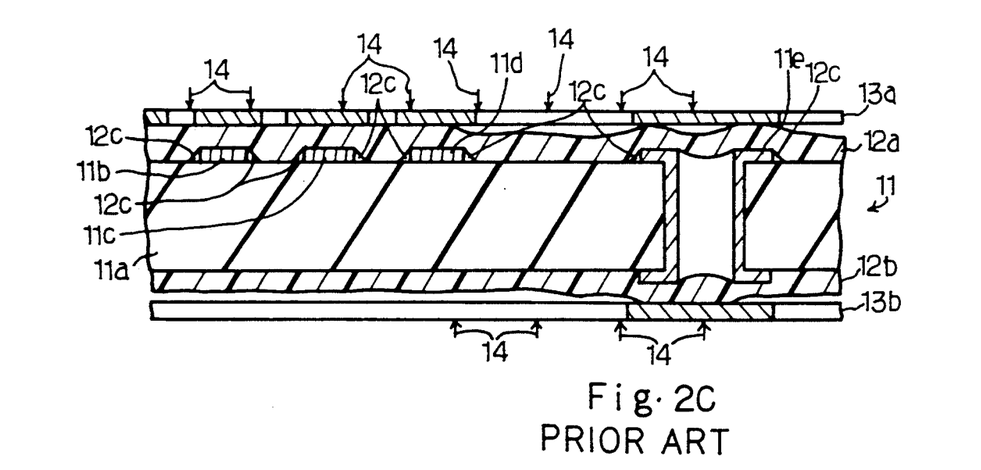
Figure 2D:
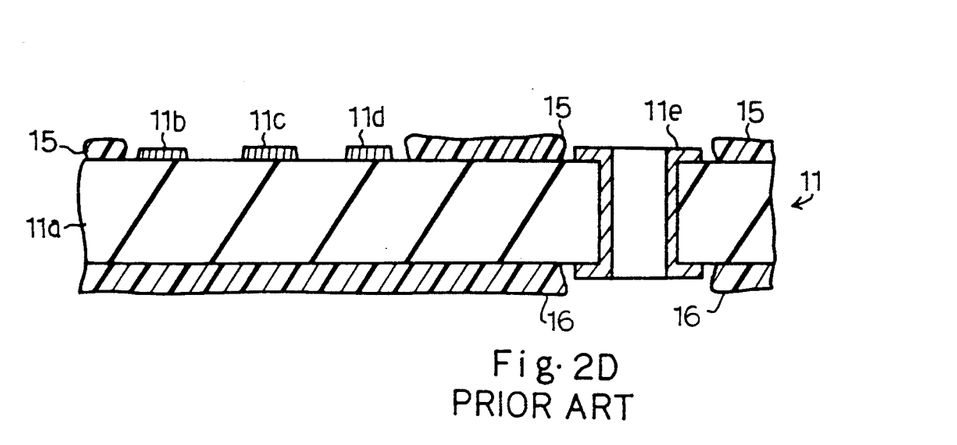
Figure 2E:
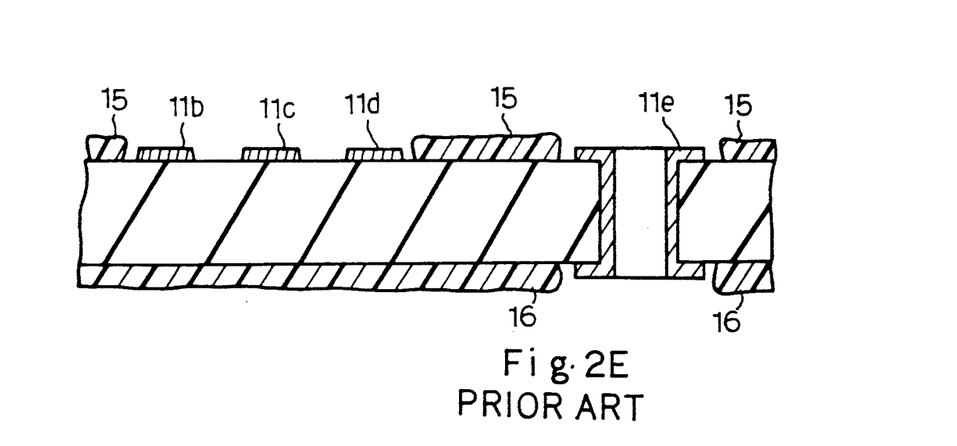

Photo-masks 13a and 13b are placed over both major surfaces of the printed wiring board 11, and ultra-violet light 14 is radiated through the photo-masks 13a and 13b to the photo-sensitive dry films 12a and 12b as shown in FIG. 2C. The photo-sensitive films 12a and 12b exposed to the ultra-violet light are photo-cured, and are resistive against developing solution. However, the photo-sensitive films 12a and 12b shielded therefrom are removed from the major surfaces in the developing solution. Since the photo-sensitive dry films 12a and 12b on the pads 11b to 11d and on the through-hole 11e are shielded from the ultra-violet light, it is reasonable that the pads 11b to 11d and the through-hole 11e are not covered with the photo-sensitive dry films 12a and 12b. However, the photo-sensitive dry films 12a and 12b between the pads 11b and 11d are removed from the major surfaces in spite of exposure to the ultra-violet light as shown in FIG. 2D. Since the gaps between the pads 11b too 11d are to narrow to produce sufficient adhesion, the photo-sensitive dry films 12a and 12b are peeled from the major surface between the pads 11b to 11d. The photo-sensitive dry films 12a and 12b left on the major surfaces can serve as solder resist films 15 and 16, and the solder resist films 15 and 16 are cured with ultra-violet light as well as with heat. However, the major surface between the pads 11b to 11d are still exposed as shown in FIG. 2E. The solder resist films 15 and 16 perfectly photo-cured allow integrated circuit chips (not shown) to be mounted on the pads 11b to 11d and to be soldered to a wiring pattern (not shown).

A problem inherent in the second prior art process is non-intentional peeling. However, the photo-sensitive dry film never penetrates in the through-hole 11e, and, accordingly, any residual is left in the through-hole 11e.

The prior art process uses either liquid photosensitive solder resist or photo-sensitive dry film, and there is not any compromise between the first and second processes.

SUMMARY OF THE INVENTION

It is therefore an important object of the present invention to provide a process of fabricating a printed wiring board which is free from problems inherent in the prior art processes.

To accomplish these objects, the present invention proposes to selectively cover a printed wiring board with a solder resistive film formed from a liquid photo-sensitive solder resist as well as with another solder resist film formed from a photo-sensitive dry film.

In accordance with one aspect of the present invention, there is provided a process of coating a printed wiring board with a solid solder resist pattern, comprising the steps of: a) preparing a printed wiring board having at least pads formed on a first area of a first major surface thereof and a through-hole open at one end thereof to a second area of the first major surface and at the other end thereof to a second major surfaces thereof opposite to the first major surface; b) coating the first area with liquid photo-sensitive solder resist so as to produce a photo-sensitive solder resist film; c) patterning the photo-sensitive solder resist film in such a manner that top surfaces of the pads are exposed from the photo-sensitive solder resist film to be patterned; d) increasing hardness of the photo-sensitive solder resist film to be patterned so as to form a first solder resist sub-pattern forming a part of the solid solder resist pattern; e) covering the first and second major surfaces, the pads and both ends of the through-hole with photo-sensitive dry films; f) patterning the photo-sensitive dry films so as to expose the pads and the first solder resist sub-pattern in the first area and both ends of the through-hole from the photo-sensitive dry films to be patterned; g) increasing hardness of the photo-sensitive dry films to be patterned so as to form a second solder resist sub-pattern forming another part of the solid solder resist patter.

In accordance with another aspect of the present invention, there is provided a process of coating a printed wiring board with a solid solder resist pattern, comprising the steps of: a) preparing a printed wiring board having at least pads formed on a first area of a first major surface thereof and a via-hole open at one end thereof to a second area of the first major surface and at the other end thereof to a second major surfaces thereof opposite to the first major surface; b) coating the first area with liquid photo-sensitive solder resist so as to produce a photo-sensitive solder resist film; c) patterning the photo-sensitive solder resist film in such a manner that top surfaces of the pads are exposed from the photo-sensitive solder resist film to be patterned; d) increasing hardness of the photo-sensitive solder resist film to be patterned so as to form a first solder resist sub-pattern forming a part of the solid solder resist pattern; e) covering the first and second major surfaces, the pads and both ends of the via-hole with photo-sensitive dry films; f) patterning the photo-sensitive dry films so as to expose the pads and the first solder resist sub-pattern in the first area from the photo-sensitive dry films to be patterned; g) increasing hardness of the photo-sensitive dry films to be patterned so as to form a second solder resist sub-pattern forming another part of the solid solder resist patter.

BRIEF DESCRIPTION OF THE DRAWINGS

The features and advantages of the process of fabricating a printed wiring board according to the present invention will be more clearly understood from the following description taken in conjunction with the accompanying drawings in which:

FIGS. 2A, 2B, 2C, 2D, and 2E are cross sectional views showing the prior art process sequence using the photo-sensitive dry film;

DESCRIPTION OF THE PREFERRED EMBODIMENTS

First Embodiment

A process sequence embodying the present invention is illustrated in FIGS. 3A to 3I. The process sequence starts with preparation of a printed wiring board 21 shown in FIG. 3A implemented by an insulating substrate 21a with pads 21b, 21c and 21d as well as with a through-hole 21e. Though not shown in the drawings, an appropriate wiring pattern is formed on the insulating substrate 21a, and the through-hole 21e and other through-holes pass through the insulating substrate 21a at a high aspect ratio. In the following description, the through-hole 21e stands for all the through-holes.

Figure 3A:
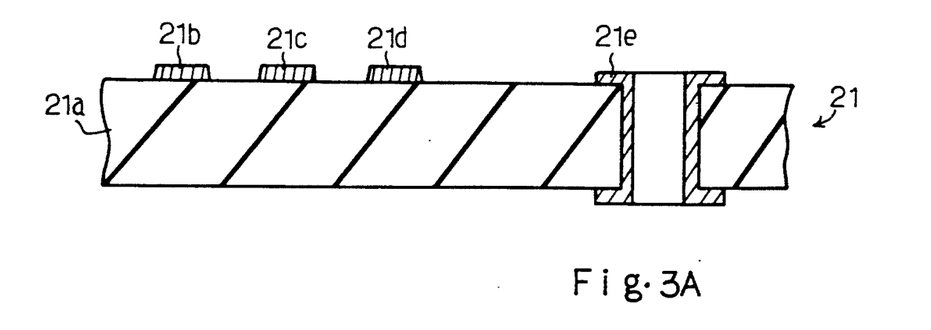
FIGS. 3A, 3B, 3C, 3D, 3E, 3F, 3G, 3H, and 3I are cross sectional views showing a process sequence according to the present invention.
Figure 3B:
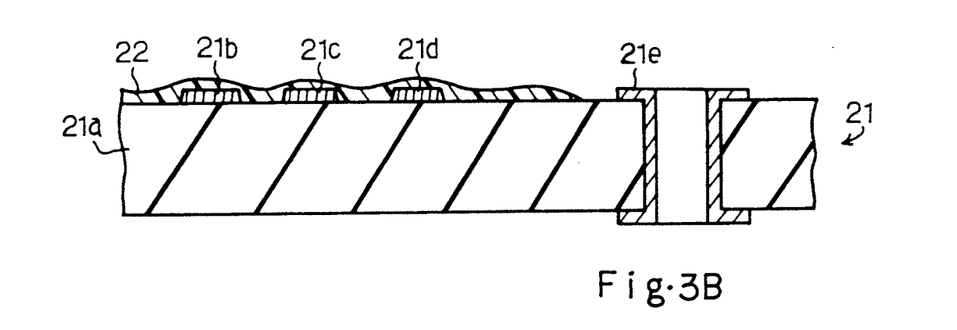

The upper major surface of the printed wiring board 21 is virtually divided into a first area assigned to the pads 21b to 21d and a second area assigned to the through-hole 21e, and the first area is coated with liquid photo-sensitive solder resist. The liquid photo-sensitive solder resist is dried so that the first area is covered with a photo-sensitive solder resist film 22 as shown in FIG. 3B. Since the liquid photo-sensitive solder resist completely spreads over the first area, any hollow space does not take place between the side edges of the pads 21b to 21d and the photo-sensitive solder resist film 22. Moreover, the second area is not coated with the liquid photo-sensitive solder resist, and any liquid photo-sensitive solder resist never flows into the through-hole 21e.

Figure 3C:
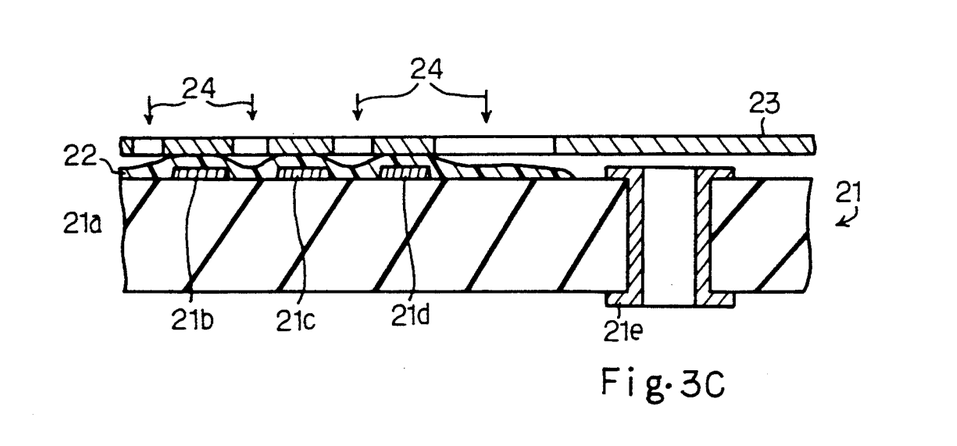
Figure 3D:
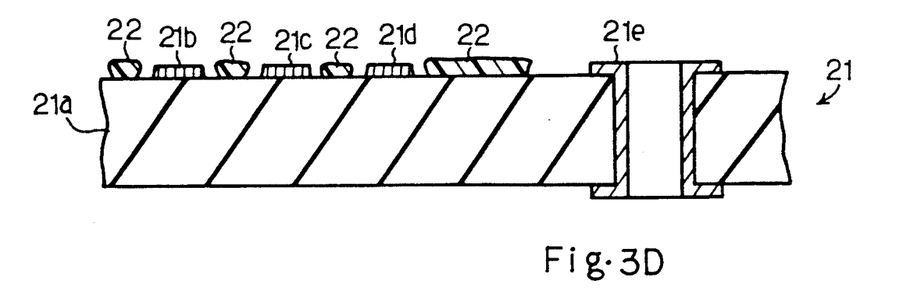

A photo-mask 23 with a predetermined pattern is moved over the photo-sensitive solder resist film 22, and electromagnetic radiation, such as ultra-violet light 24 is radiated through the photo-mask 23 to the photo-sensitive solder resist film 22 as shown in FIG. 3C. Since the photo-mask 23 shields the photo-sensitive solder resist film 22 on the pads 21b to 21d from the ultra-violet light 24, the photo-sensitive solder resist film 22 on the pads 21b to 21d is soluble in developing solution. However, the photo-mask 23 exposes the photo-sensitive solder resist film 22 directly contact with the upper major surface of the insulating substrate 21a to the ultra-violet light 24, and allows the photo-sensitive solder resist film 22 exposed to the ultra-violet light 24 to be photo-cured. Therefore, the photo-sensitive solder resist film 22 to be photo-cured is left on the first area as shown in FIG. 3D.

Figure 3E:
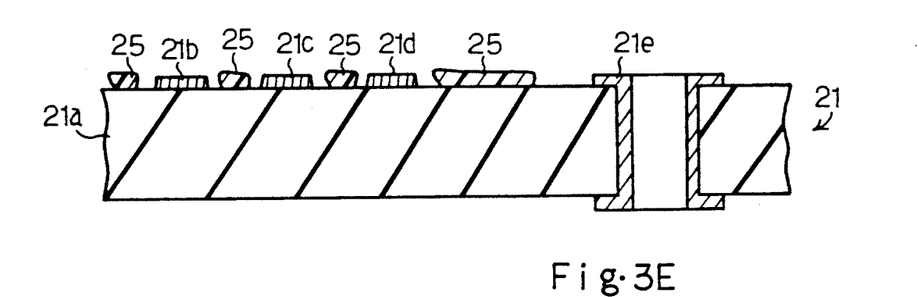

The photo-sensitive solder resist film 22 thus left on the first area is baked or treated with heat, and a first solder resist sub-pattern 25 is formed in the first area of the upper major surface of the printed wiring board 21 as shown in FIG. 3E.

Figure 3F:
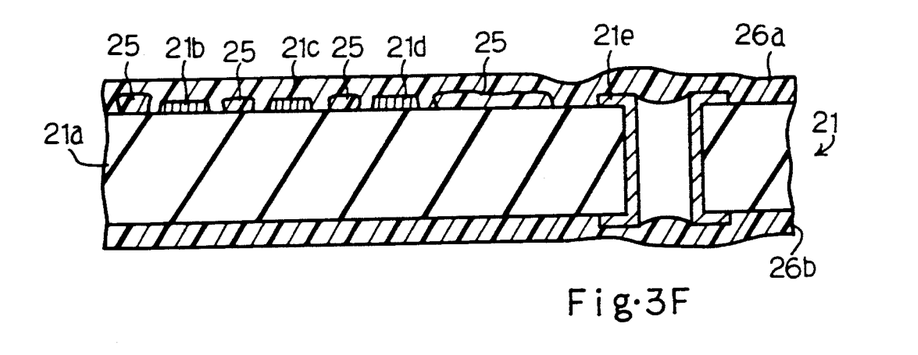
Figure 3G:
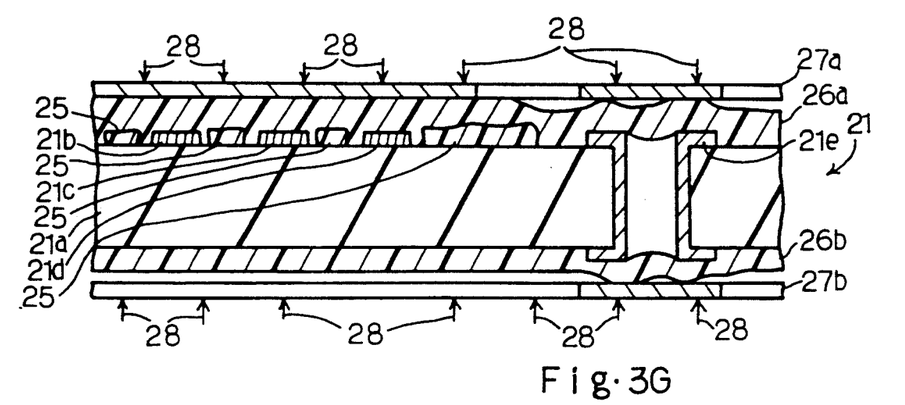

Subsequently, photo-sensitive dry films 26a and 26b are laminated on both major surfaces of the printed wiring board 21 as shown in FIG. 3F, and photo-masks 27a and 27b with respective patterns are provided over the photo-sensitive dry films 26a and 26b. Ultra-violet light 28 is radiated through the photo-masks 27a and 27b to the photo-sensitive dry films 26a and 26b as shown in FIG. 3G. The photo-mask 27a shields the first area of the upper major surface and the through-hole 21e from the ultra-violet light, and, accordingly, the photo-sensitive dry film 26a on the first area and on the through-hole 21e is soluble in developing solution. Since distance between the through hole 21e and the adjacent through-hole is larger than the distances between the pads 21b to 21d, any hollow space hardly takes place between the second area of the upper major surface and the photo-sensitive dry film 26a, and the photo-sensitive dry film 26a never peels from the second area.

Figure 3H:
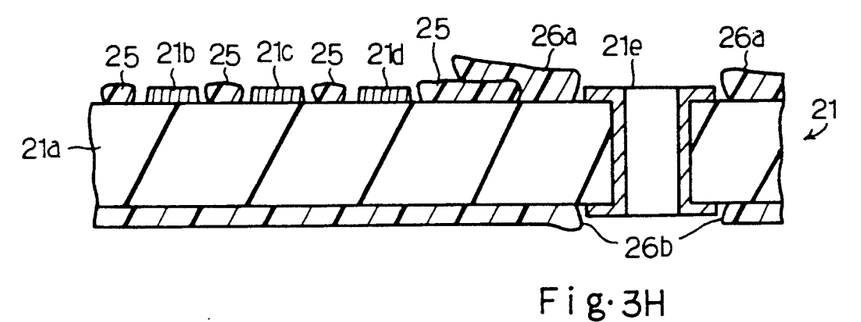
Figure 3I:
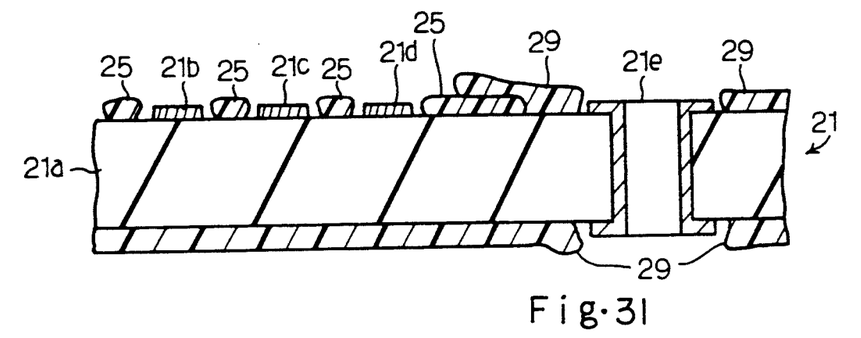

The photo-sensitive dry films 26a and 26b exposed to the ultra-violet light are photo-cured, and withstand against the developing solution. Therefore, the photo-sensitive dry films 26a and 26b are partially left on the second area of the upper major surface and the lower major surface of the printed wiring board 21 as shown in FIG. 3H. The photo-sensitive dry films 26a and 26b left on the upper and lower major surfaces are cured with ultra-violet light as well as with heat for increasing the hardness, and a second solder resist sub-pattern 29 is formed on the second area of the upper major surface and on the lower major surface of the printed wiring board 21 as shown in FIG. 3I.

As will be appreciated from the foregoing description, the process according to the present invention appropriately uses liquid photo-sensitive solder resist and photo-sensitive dry films, and any residual liquid photo-sensitive solder resist is not left in the through-hole. Moreover, the photo-sensitive dry films are used for the second area assigned to the through-hole and for the lower major surface only, and, for this reason, never peel therefrom.

Second Embodiment

Turning to FIGS. 4A to 4I, another process sequence embodying the present invention is illustrated. The process sequence starts with preparation of a printed wiring board 31 shown in FIG. 4A implemented by an insulating substrate 31a with pads 31b, 31c and 31d as well as with a via-hole 31e. Though not shown in the drawings, an appropriate wiring pattern is formed on the insulating substrate 31a, and other via-holes and through-hole further pass through the insulating substrate 31a at a high aspect ratio. In the following description, the via-hole 31e stands for all the via-holes.

Figure 4A:
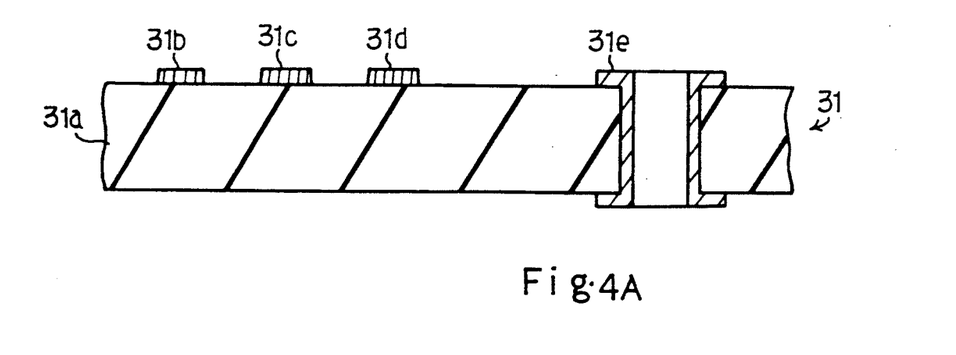
FIGS. 4A, 4B, 4C, 4D, 4E, 4F, 4G, 4H and 4I are cross sectional views showing another process sequence according to the present invention.
Figure 4B:
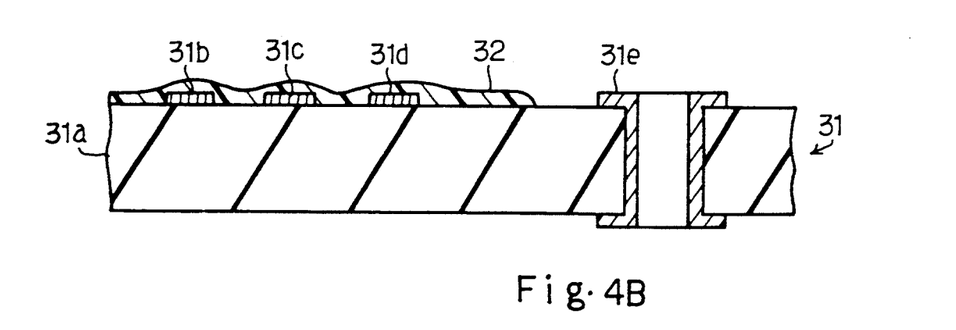

The upper major surface of the printed wiring board 31 is virtually divided into a first area assigned to the pads 31b to 31d and a second area assigned to the through-holes and the via-hole 31e, and the first area is coated with liquid photo-sensitive solder resist. The liquid photo-sensitive solder resist is dried so that the first area is covered with a photo-sensitive solder resist film 32 as shown in FIG. 4B. Since the liquid photo-sensitive solder resist well spreads over the first area, any hollow space does not take place between the side edges of the pads 31b to 31d and the photo-sensitive solder resist film 32. Moreover, the second area is not coated with the liquid photo-sensitive solder resist, and any liquid photo-sensitive solder resist does not flow into the through holes and the via-hole 31e.

Figure 4C:
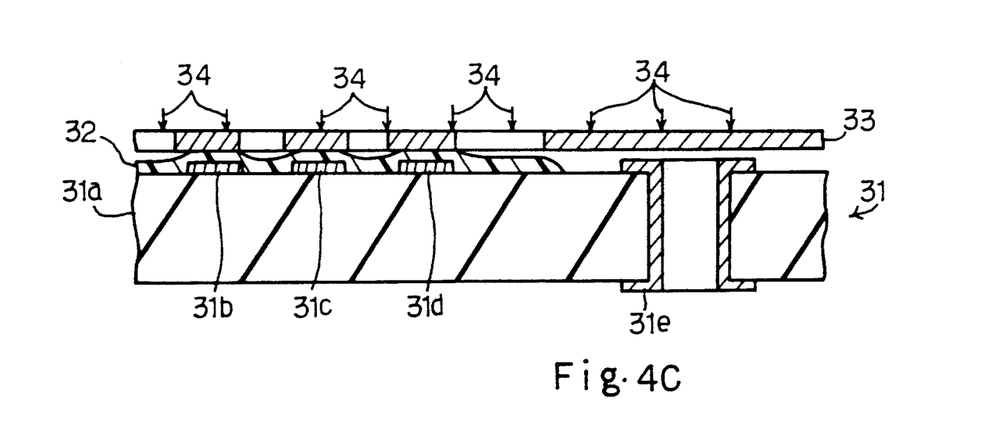
Figure 4D:
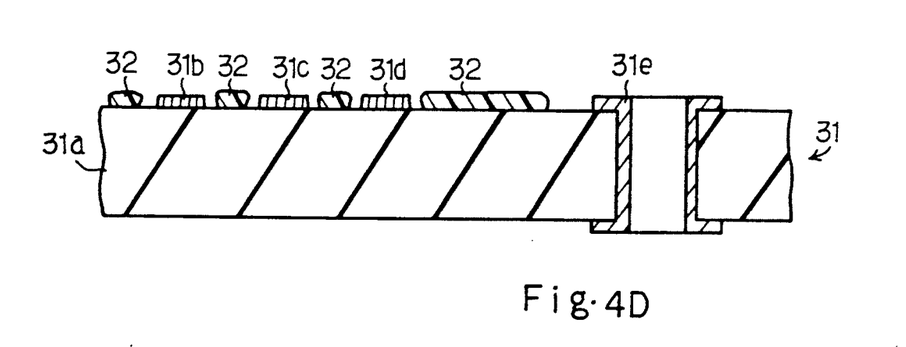

A photo-mask 33 with a predetermined pattern is moved over the photo-sensitive solder resist film 32, and ultra-violet light 34 is radiated through the photo-mask 33 to the photo-sensitive solder resist film 32 as shown in FIG. 4C. Since the photo-mask 33 shields the photo-sensitive solder resist film 32 on the pads 31b to 31d from the ultra-violet light 34, the photo-sensitive solder resist film 32 on the pads 31b to 31d is soluble in developing solution. However, the photo-mask 33 exposes the photosensitive solder resist film 32 directly contact with the upper major surface of the insulating substrate 31a to the ultra-violet light 34, and allows the photo-sensitive solder resist film 32 exposed to the ultra-violet light 34 to be photo-cured. Therefore, the photo-sensitive solder resist film 32 to be photo-cured is left on the first area as shown in FIG. 4D.

Figure 4E:
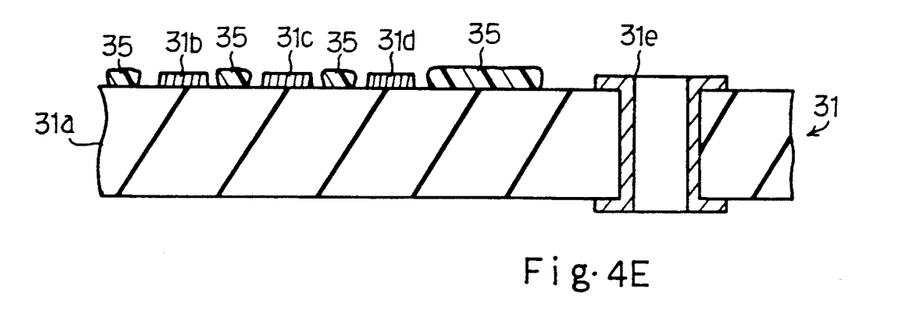

The photo-sensitive solder resist film 32 thus left on the first area is baked or treated with heat, and a first solder resist sub-pattern 35 is formed in the first area of the upper major surface of the printed wiring board 31 as shown in FIG. 4E.

Figure 4F:
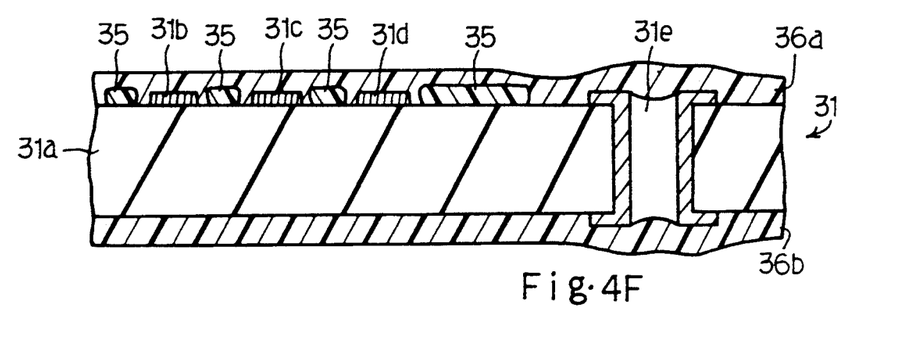
Figure 4G:
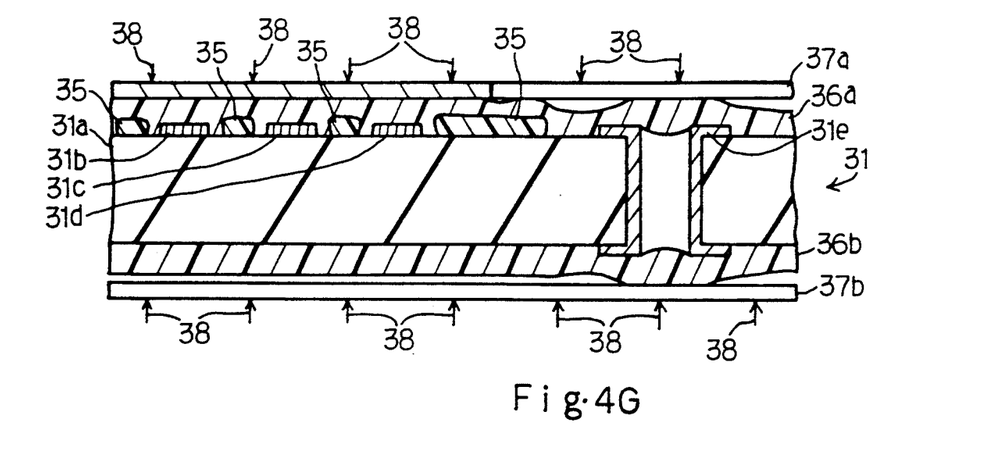

Subsequently, photo-sensitive dry films 36a and 36b are laminated on both major surfaces of the printed wiring board 31 as shown in FIG. 4F, and photo-masks 37a and 37b with respective patterns are provided over the photo-sensitive dry films 36a and 36b. Ultra-violet light 38 is radiated through the photo-masks 37a and 37b to the photo-sensitive dry films 36a and 36b as shown in FIG. 4G. The photo-mask 37a shields the first area of the upper major surface and the through-holes from the ultra-violet light, and, accordingly, the photo-sensitive dry film 36a on the first area and on the through-holes is soluble in developing solution. Since distance between the via-hole 31e and the adjacent via-hole/through-hole is larger than the distances between the pads 31b to 31d, any hollow space hardly takes place between the second area of the upper major surface and the photo-sensitive dry film 36a, and the photo-sensitive dry film 36a never peels from the second area. The photo-masks 37a and 37b expose the photosensitive dry films 36a and 36b on both edges of the via-hole 31e to the ultra-violet light 38 for tenting.

Figure 4H:
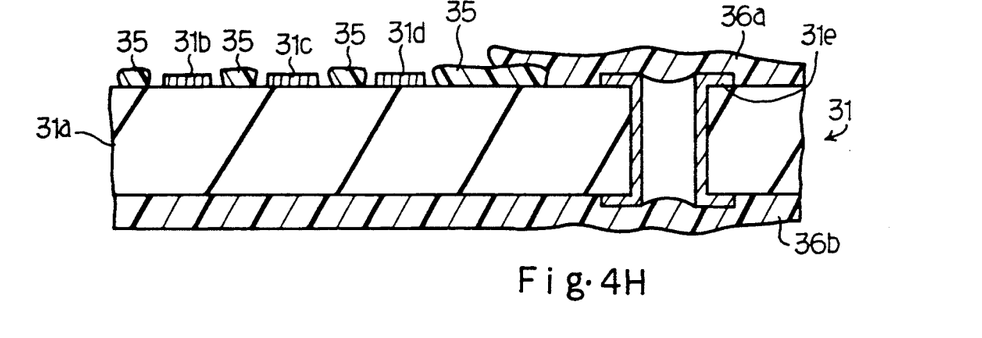
Figure 4I:
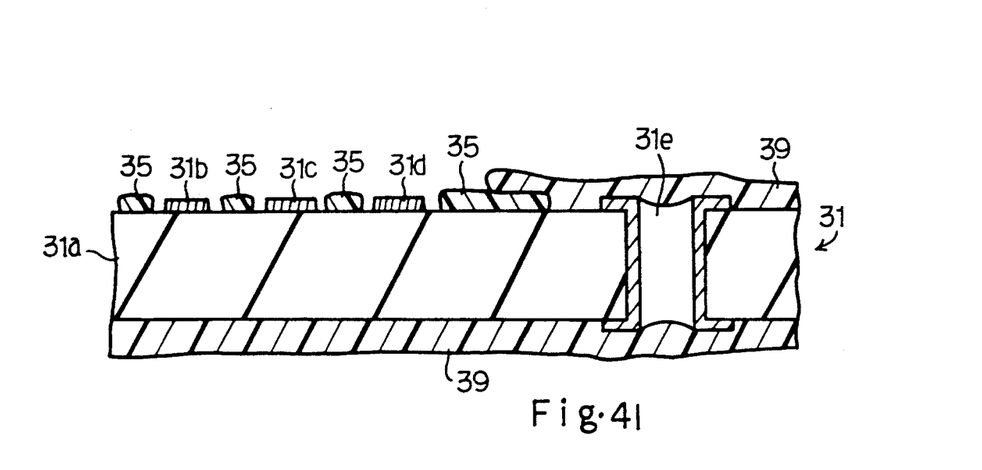

The photo-sensitive dry films 36a and 36b exposed to the ultra-violet light are photo-cured, and withstand against the developing solution. Therefore, the photo-sensitive dry films 36a and 36b are partially left on the second area of the upper major surface and the lower major surface of the printed wiring board 31 as shown in FIG. 4H. The photo-sensitive dry films 36a and 36b left on the upper and lower major surfaces are cured with ultra-violet light as well as with heat for increasing the hardness, and a second solder resist sub-pattern 39 is formed on the second area of the upper major surface and on the lower major surface of the printed wiring board 31 as shown in FIG. 4I.

Thus, the second solder resist sub-pattern 39 allows the through-holes to be open at both major surfaces of the printed wiring board 31, and covers both edges of the viahole 31e. Therefore, the process according to the present invention is available for tenting of the via-holes.

Although particular embodiments of the present invention have been shown and described, it will be obvious to those skilled in the art that various changes and modifications may be made without departing from the spirit and scope of the present invention. For example, the printed wiring board may be stacked to form a multi-layer printed wiring board.

What is claimed is:

1. A process of coating a printed wiring board having pads in a first area and a through hole in a second area, the process comprising:

coating the first area with a liquid solder resist;

removing a portion of the liquid solder resist to form a liquid solder resist sub-pattern;

coating the second area and at least a portion of the liquid solder resist sub-pattern with a dry solder resist film, including coating the dry solder resist film directly on the portion of the liquid solder resist sub-pattern;

removing a portion of the dry solder resist film to form a solid solder resist pattern, the solid solder resist pattern including a liquid solder resist portion and a dry solder resist film portion, the liquid solder resist portion being disposed between the dry solder resist film portion and the printed wiring board.

2. The process set forth in claim 1 wherein removing a portion of the liquid solder resist includes leaving the liquid solder resist sub-pattern around the pads in the first area.

3. The process set forth in claim 1 including treating the liquid solder resist sub-pattern with heat prior to coating the portion of the liquid solder resist sub-pattern.

4. The process set forth in claim 3 wherein removing a portion of the liquid solder resist includes leaving the liquid solder resist sub-pattern around the pads in the first area and wherein removing a portion of the dry solder resist film includes leaving the dry solder resist film portion around the through hole in the second area.

5. The process set forth in claim 3 wherein removing a portion of the liquid solder resist includes leaving the liquid solder resist sub-pattern around the pads in the first area and wherein removing a portion of the dry solder resist film includes leaving the dry solder resist film portion over the through hole in the second area.

6. The process set forth in claim 1 wherein removing a portion of the dry solder resist film includes leaving an outer periphery portion of the dry solder resist film portion disposed directly on the at least a portion of the liquid solder resist sub-pattern.

7. The process set forth in claim 6 wherein the outer periphery portion is adjacent to the through hole.

* * * * *